(12) United States Patent
Chandran et al.

(10) Patent No.: US 9,362,378 B2
(45) Date of Patent: Jun. 7, 2016

(54) PIEZOELECTRIC DEVICES AND METHODS FOR THEIR PREPARATION AND USE

(75) Inventors: Maneesh Chandran, Calicut (IN); M. S. Ramachandra Rao, Chennai (IN)

(73) Assignee: Indian Institute of Technology Madras, Chennai (IN)

( * ) Notice: Subject to any disclaimer, the term of this patent is extended or adjusted under 35 U.S.C. 154(b) by 332 days.

(21) Appl. No.: 13/583,742

(22) PCT Filed: Dec. 20, 2011

(86) PCT No.: PCT/IB2011/003086
§ 371 (c)(1),
(2), (4) Date: Sep. 10, 2012

(87) PCT Pub. No.: WO2013/061108
PCT Pub. Date: May 2, 2013

(65) Prior Publication Data
US 2013/0153924 A1  Jun. 20, 2013

(30) Foreign Application Priority Data

Oct. 28, 2011  (IN) .......................... 3693/CHE/2011

(51) Int. Cl.
| | |
|---|---|
| H01L 29/15 | (2006.01) |
| H01L 29/66 | (2006.01) |
| H01L 41/08 | (2006.01) |
| H01L 41/319 | (2013.01) |
| H01L 21/36 | (2006.01) |
| H01L 29/16 | (2006.01) |
| H01L 29/84 | (2006.01) |

(Continued)

(52) U.S. Cl.
CPC .... *H01L 29/66015* (2013.01); *H01L 21/02521* (2013.01); *H01L 21/36* (2013.01); *H01L 29/1602* (2013.01); *H01L 29/84* (2013.01); *H01L 41/0815* (2013.01); *H01L 41/316* (2013.01); *H01L 41/319* (2013.01); *H01L 41/1876* (2013.01); *H03H 9/02582* (2013.01)

(58) Field of Classification Search
USPC .............................. 257/77; 438/478, 50, 778
See application file for complete search history.

(56) References Cited

U.S. PATENT DOCUMENTS

| | | | |
|---|---|---|---|
| 5,320,865 A | 6/1994 | Nakahata et al. | |
| 6,248,349 B1 | 6/2001 | Suzuki et al. | |

(Continued)

FOREIGN PATENT DOCUMENTS

| | | |
|---|---|---|
| EP | 0534355 A1 | 3/1993 |
| EP | 1300945 A2 | 4/2003 |

(Continued)

OTHER PUBLICATIONS

Chandran et al. "Integration of perovskite PZT thin films on diamond substrate without buffer layer" IOP Publishing J. Phys. D: Appl. Phys. 45 (2012) 202001 (5pp), Published May 4, 2012, pp. 1-5.*
Kusterer et al. "Piezo-actuated nanodiamond cantilever technology for high-speed applications", Science Direct Diamond & Related Materials 17 (2008), Feb. 15, 2008, pp. 1429-1433.*

(Continued)

*Primary Examiner* — Shaun Campbell
(74) *Attorney, Agent, or Firm* — Pepper Hamilton LLP

(57) ABSTRACT

Methods for fabricating a piezoelectric device are provided. The methods can include providing a substrate and forming a nanocrystalline diamond layer on a first surface of the substrate. The methods can also include depositing a piezoelectric layer on a first surface of the nanocrystalline diamond layer.

9 Claims, 4 Drawing Sheets

(51) Int. Cl.
   *H01L 41/316*   (2013.01)
   *H01L 21/02*    (2006.01)
   *H03H 9/02*     (2006.01)
   *H01L 41/187*   (2006.01)

(56) References Cited

U.S. PATENT DOCUMENTS

| | | | |
|---|---|---|---|
| 6,248,394 | B1 | 6/2001 | Du et al. |
| 6,661,152 | B2 | 12/2003 | Ishibashi et al. |
| 6,794,683 | B2 | 9/2004 | Tatsumi et al. |
| 7,579,759 | B2 | 8/2009 | Lee et al. |
| 2003/0137217 | A1 | 7/2003 | Ishibashi et al. |
| 2003/0180984 | A1 | 9/2003 | Tatsumi et al. |
| 2008/0191336 | A1* | 8/2008 | Tsai .............................. 257/682 |
| 2008/0303378 | A1 | 12/2008 | Lee et al. |
| 2010/0052471 | A1* | 3/2010 | Shih et al. ................. 310/313 B |
| 2013/0062996 | A1* | 3/2013 | Udayakumar .......... H01L 27/20 310/321 |

FOREIGN PATENT DOCUMENTS

| | | |
|---|---|---|
| EP | 1375704 A1 | 1/2004 |
| JP | 05-067941 A | 3/1993 |
| JP | 5083067 A | 4/1993 |
| JP | H08181286 A | 7/1996 |
| JP | 2000199049 A | 7/2000 |
| JP | 2002098622 A | 4/2002 |
| JP | 2003034592 A | 2/2003 |
| JP | 2003112995 A | 4/2003 |
| JP | 2003221294 A | 8/2003 |
| JP | 2010057155 A | 3/2010 |
| KR | 20030029505 A | 4/2003 |
| TW | 201010274 A | 3/2010 |
| WO | WO 02/42527 A1 | 5/2002 |

OTHER PUBLICATIONS

International Search Report and Written Opinion for PCT/IB2011/003086 dated Mar. 14, 2012.

Akai et al., Ferroelectric properties of sol-gel delivered epitaxial Pb(Zrx,Ti1-x)O3 thin films on Si using epitaxial γ-Al2O3 Layers, *Applied Physics Letters* (May 11, 2005), 86(20):202906-202906-3.

Chandrahalim et al., Performance comparison of $Pb(Zr_{0.52}Ti_{0.48})O_3$-only and $Pb(Zr_{0.52}Ti_{0.48})O_3$-on-silicon resonators, *Applied Physics Letters* (Dec. 10, 2008), 93:233504-1-233504-3.

Chang et al., Fabrication and characterization of metal-ferroelectric $(PbZr_{0.53}Ti_{0.47}O_3)$- insulator $(Dy_2O_3)$-semiconductor capacitors for nonvolatile memory applications, *Applied Physics Letters* (Feb. 17, 2006), 88:072917-1-072917-3.

Du et al., Growth and measurements of ferroelectric lead zirconate titanate on diamond by pulsed laser deposition, *Journal of Applied Physics* (May 17, 1999), 86(4):2220-2225.

Knight et al., Characterization of diamond films by Raman spectroscopy, *Journal of Materials Research* (1989), 4(2):385-393.

Kuwabara et al., Strain and in-plane orientation effects on the ferroelectricity of (111)-oriented tetragonal $Pb(Zr_{0.35}Ti_{0.65})O_3$ thin films prepared by metal organic chemical vapor deposition, *Applied Physics Letters* (May 29, 2007), 90(20):222901-222901-3.

Lee et al., Polarized Raman scattering of epitaxial $Pb(Zr,Ti)O_3$ thin films in the tetragonal-phase field, *Applied Physics Letters* (Sep. 23, 2002), 81(13): 2439-2441.

Srinivasan et al., Piezoelectric/ultrananocrystalline diamond heterostructures for high-performance multifunctional micro/nanoelectromechanical systems, *Applied Physics Letters* (Mar. 26, 2007), 90(13):134101-134101-3.

Rujijanagul et al., Improvement of ferroelectric and dielectric properties of annealed pyrochlore free PZT based ceramics, CMU Intellectual Repository, Faculty of Science, Conference Paper (2011), p. 1-2.

* cited by examiner

PIEZOELECTRIC DEVICES AND METHODS FOR THEIR PREPARATION AND USE

CROSS REFERENCE TO RELATED APPLICATIONS

This application is a U.S. national stage filing under 35 U.S.C. §371 of International Application No. PCT/IB2011/003086, filed on Dec. 20, 2011, entitled "Piezoelectric Devices and Methods for Their Preparation and Use," which claims priority of India Application No. 3693/CHE/2011 filed on Oct. 28, 2011, the disclosures of which are incorporated by reference in their entireties.

BACKGROUND

Piezoelectric devices are known and are in use in a variety of applications. Typically, such devices include piezoelectric material layers (e.g., a lead zirconate titanate (PZT) layer) integrated with silicon-based semiconductors and such hybrid structures are used for applications such as micro-electro-mechanical-systems (MEMS) sensors and actuators, surface acoustic wave (SAW) devices and non-volatile memory devices. However, silicon-based devices have limitations such as ambient temperature operation and other issues like interface diffusion between an insulator and the silicon substrate and formation of natural silicon oxide layer.

Certain piezoelectric devices employ diamond substrates that have relatively higher thermal conductivity, large band gap and higher resistivity as compared to the silicon-based devices. Moreover, diamond has substantially high acoustic wave velocity and integration of diamond substrate with piezoelectric material layer provides an opportunity to fabricate SAW devices that may be used for high frequency applications.

Unfortunately, it is difficult to deposit a piezoelectric material layer on the diamond substrate without use of a buffer layer such as platinum or strontium titanate due to thermal expansion mismatch between the piezoelectric material layer such as PZT layer and diamond substrate. In particular, it is difficult to form perovskite phase PZT layer on a diamond substrate. Typically, formation of pyrochlore PZT is the predominant phase in the PZT layers deposited directly diamond substrate. However, pyrochlore PZT does not exhibit piezoelectric or ferroelectric properties thereby rendering them unsuitable for device fabrication.

SUMMARY

The foregoing summary is illustrative only and is not intended to be in any way limiting. In addition to the illustrative aspects, embodiments, and features described above, further aspects, embodiments, and features will become apparent by reference to the drawings and the following detailed description.

Briefly, in accordance with one aspect, a method for fabricating a piezoelectric device is provided. The method includes providing a substrate and forming a nanocrystalline diamond layer on a first surface of the substrate. The method also includes depositing a piezoelectric layer on a first surface of the nanocrystalline diamond layer.

In accordance with another aspect, a method for fabricating a piezoelectric device is provided. The method includes providing a diamond substrate and depositing a lead zirconate titanate layer on a first surface of the diamond substrate such that the lead zirconate titanate layer is a crystalline perovskite phase layer.

In accordance with another aspect, a piezoelectric device is provided. The piezoelectric device includes a substrate. A nanocrystalline diamond layer is deposited on a first surface of the substrate and a perovskite piezoelectric layer is deposited on a first surface of the nanocrystalline diamond layer.

In accordance with another aspect, a method of using a piezoelectric device as a surface acoustic wave device is provided. The method includes providing a piezoelectric device. The piezoelectric device includes a substrate, a nanocrystalline diamond layer deposited on a first surface of the substrate and a perovskite piezoelectric layer deposited on a first surface of the nanocrystalline diamond layer. The method also includes depositing an interdigital transducer layer on the perovskite piezoelectric layer of the piezoelectric device.

DETAILED DESCRIPTION

Figure 1:
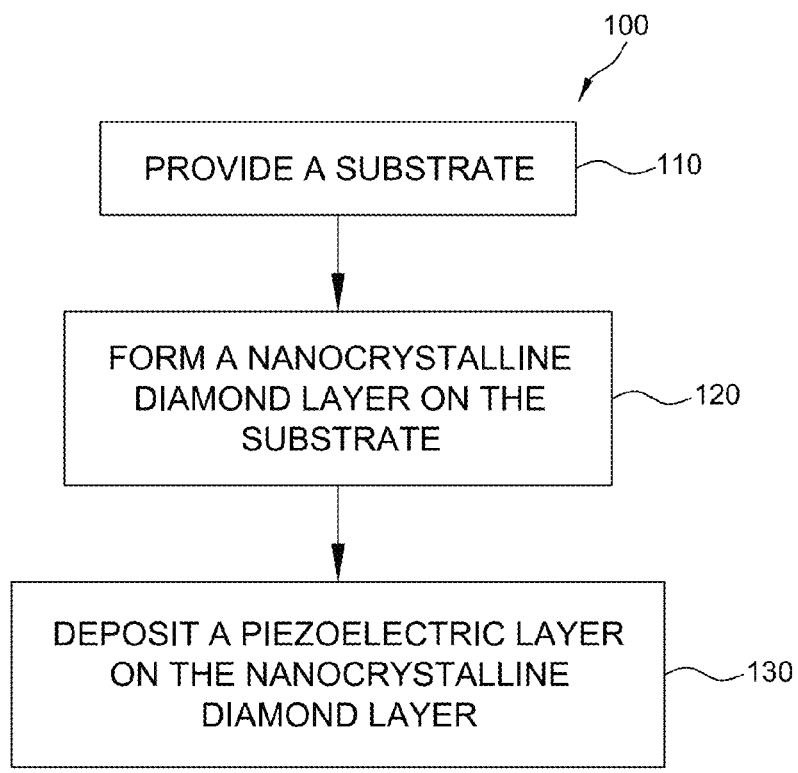
FIG. 1 is an example flow diagram of an embodiment of a method for fabricating a piezoelectric device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Example embodiments are generally directed to piezoelectric devices and methods for their preparation and use. The technique facilitates direct deposition of a perovskite piezoelectric layer on a diamond substrate to form piezoelectric devices that may be useful in a variety of applications such as telecommunication and sensing applications.

Referring now to FIG. 1, an example flow diagram 100 of an embodiment of a method for fabricating a piezoelectric device is illustrated. At block 110, a substrate is provided. In one example embodiment, the substrate includes silicon. A nanocrystalline diamond layer (NCD) layer is formed on a first surface of the substrate (block 120). In this embodiment, the NCD layer is formed using a chemical vapor deposition (CVD) technique such as hot filament chemical vapor deposition (HFCVD) and microwave plasma chemical vapor deposition (MPCVD) techniques. In another embodiment, the NCD layer is formed using a dc arcjet reactor or a combustion reactor. In certain embodiments, the NCD layer includes diamond layer formed using high pressure high temperature (HPHT) technique.

In one example embodiment, substrate with pre-deposited NCD layer is used for the piezoelectric device. Such NCD substrates are commercially available from companies, such as Element Six of Luxembourg and sp3 Diamond Technologies of California, USA.

In some embodiments, the substrate can be etched prior to forming the NCD layer. Etching can be performed in a variety of manners, including treatment with acid. The cleaned substrate is then seeded with diamond nanoparticles. The seeded substrate is placed in a CVD reactor and is heated to a deposition temperature using an array of hot filament within the CVD reactor.

A NCD layer is chemical vapor deposited onto the first surface of the heated substrate by passing a gaseous mixture of a hydrocarbon and hydrogen ($H_2$) into the CVD reactor. Examples of hydrocarbons include methane, ethane, acetylene, ethanol and methanol. In an example embodiment, a gaseous mixture of methane and hydrogen is used for depositing the NCD layer. The hydrocarbon flow rate can generally be any flow rate. In one example embodiment, the hydrocarbon flow rate is about 40 sccm (standard cubic centimeters per minute) to about 90 sccm. The hydrogen flow rate can generally be any flow rate. In one example embodiment, the hydrogen flow rate is about 1500 sccm to about 3000 sccm. The pressure within the CVD reactor can generally be any pressure. In one example embodiment, the pressure is about 5 Torr (666.61 Pa) to about 60 Torr (8000 Pa). It should be noted that the NCD layer deposited on the substrate can exhibit substantially similar properties as single crystal diamond.

At block 130, a piezoelectric layer is deposited on a first surface of the NCD layer. In one embodiment, the piezoelectric layer includes lead zirconate titanate (PZT). In another embodiment, the piezoelectric layer includes lead lanthanum zirconate titanate (PLZT). In this example embodiment, the piezoelectric layer has a perovskite structure. As used herein, the term "perovskite structure" refers to a rhombohedral or tetragonal structure in which the larger lead (Pb) cation and oxygen anion together form a non-centrosymmetric structure that is responsible for piezoelectric property.

In this example embodiment, the piezoelectric layer is deposited on the NCD layer using a pulsed laser deposition (PLD) technique. The PLD technique used here for depositing the piezoelectric layer facilitates deposition of a perovskite phase layer. In operation, a piezoelectric target and the substrate with the deposited NCD layer are placed within a PLD chamber and are exposed to a laser source to deposit the piezoelectric layer. In this embodiment, a ceramic target having composition $PbZr_{0.52}Ti_{0.48}O_3$ is prepared using conventional solid state reaction. In certain example embodiments, lead oxide (PbO) may be added to the target to compensate for lead and oxygen loss during deposition and post annealing process.

Subsequently, a working gas such as oxygen is introduced within the PLD chamber and the pressure within the chamber is maintained at a pre-defined deposition pressure. Further, a deposition temperature within the PLD chamber is about 525° C. to about 600° C. The deposited piezoelectric layer is subsequently annealed at the deposition temperature for about 1 hour. The annealing of the deposited layer enhances the crystallinity of the layer. In one example embodiment, the annealing time of the piezoelectric layer is about 30 minutes to about 2 hours.

Figure 2:
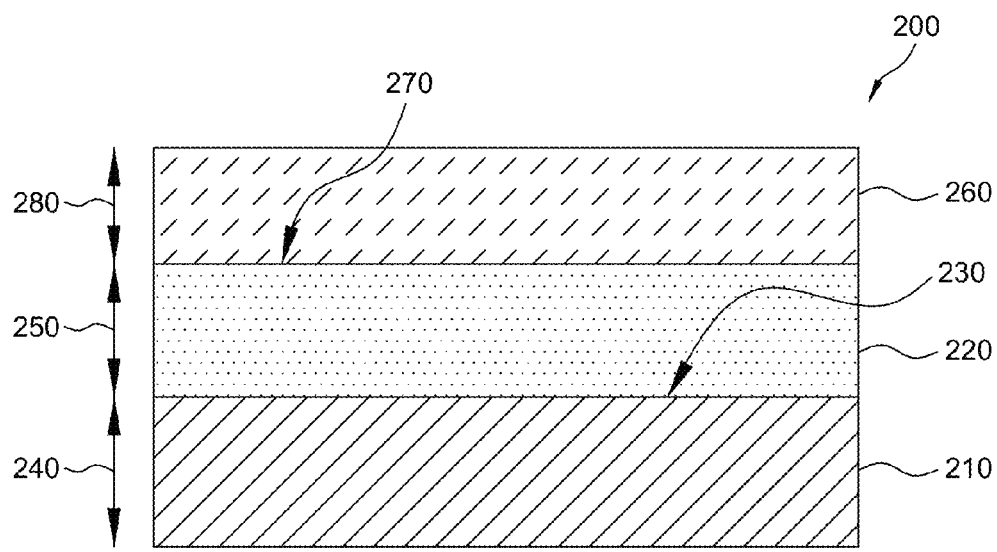
FIG. 2 is an example piezoelectric device fabricated using the method of FIG. 1.

FIG. 2 illustrates an example piezoelectric device 200. The piezoelectric device 200 includes a substrate 210 and a nanocrystalline diamond (NCD) layer 220 deposited on a first surface 230 of the substrate 210. In this example embodiment, the substrate 210 includes silicon. The NCD layer 220 is deposited on the substrate 210 using chemical vapor deposition (CVD) techniques that are well known in the art. The substrate 210 can generally have any thickness 240. In the illustrated embodiment, a thickness 240 of the substrate 210 is about 100 microns to about 1000 microns. The NCD layer 220 can generally have any thickness 250. For example, a thickness 250 of the NCD layer 220 is about 0.5 microns to about 10 microns.

The piezoelectric device 200 includes a perovskite piezoelectric layer 260 directly deposited on a first surface 270 of the NCD layer 220. The perovskite piezoelectric layer 260 can be deposited on the NCD layer 220 using pulsed laser deposition (PLD) technique. In one example embodiment, the perovskite piezoelectric layer 260 comprises lead zirconate titanate (PZT). In an alternate embodiment, the perovskite piezoelectric layer 260 comprises lead lanthanum zirconate titanate (PLZT). It should be noted that the use of PLZT as the perovskite piezoelectric layer 260 facilitates tuning of dielectric and ferroelectric properties of the piezoelectric device 200. The perovskite piezoelectric layer 260 can generally have any thickness 280. For example, a thickness 280 of the perovskite piezoelectric layer 260 is about 100 nanometers to about 800 nanometers.

The piezoelectric device 200 described above may be used in a variety of applications. For example, the piezoelectric device 200 may be used as a surface wave acoustic (SAW) device, or as a micro-electro-mechanical-system (MEMS) device. In one example embodiment, an interdigital transducer (IDT) layer (not shown) may be deposited on the perovskite piezoelectric layer 260 of the piezoelectric device 200 to form a SAW device that may be incorporated into a telecommunications device or a sensing device. The IDT layer includes patterned metallic strips formed of platinum or tantalum. However, other suitable materials may be used. The IDT layer includes one or more interdigital transducers and reflectors to convert acoustic waves to electrical signals and vice versa. One or more same or different piezoelectric devices 200 may be used, depending on the particular desired use.

The example methods described above enable direct deposition of a PZT perovskite phase layer on a diamond substrate. The technique discussed herein facilitates reliable integration of PZT layer on a diamond substrate without the need of a buffer layer. Advantageously, the devices with PZT layer on diamond substrate can be used as high frequency surface acoustic wave devices owing to the substantially high acoustic velocity of diamond. Such devices have substantially high sensitivity, better specificity and enhanced resolution.

The surface acoustics devices formed using the technique described above may be used in telecommunications and sensing applications. For example, surface acoustic wave sensors may be coated with a film that serves as a chemical-to-physical transducer and such sensors may be employed in chemical sensing applications. The film may include a polymer material that exhibits a change in one or more of its physical properties in response to presence of a chemical to be sensed. Such sensors may be used to detect chemical vapors, nerve agents, blood agents and chemical warfare substances, among others. Furthermore, such devices may be used for filters, resonators, mobile switching systems and global positioning systems. Such devices may also be used for SONAR (Sound Navigation and Ranging) applications.

EXAMPLES

The present invention will be described below in further detail with examples and comparative examples thereof, but it is noted that the present invention is by no means intended to be limited to these examples.

Example 1

Deposition of a NCD Layer on a Silicon Substrate

The silicon substrate having a thickness of about 2 inches was used for depositing the NCD layer. Such silicon substrates are commercially available with a thickness of about 2 inches to about 12 inches from companies such as MTI Corporation, USA. The silicon substrate 210 was etched prior to forming the NCD layer. The silicon substrate 210 was etched using about 10% of hydrochloric acid for a time period of about 30 seconds. Subsequently, the silicon substrate 210 was dipped into ammonia and hydrogen peroxide solution having a ratio of about 1:1 for about 5 minutes followed by cleaning of the substrate 210 with ethyl alcohol.

The cleaned substrate 210 was then seeded with diamond nanoparticles. The diamond nanoparticles included detonation diamond nanoparticles having a particle size of about 4 nanometers. The diamond nanoparticles were dispersed in dimethyl sulfoxide (DMSO) and were obtained from the International Technology Centre (ITC) of USA. The seeded substrate was then placed in a CVD reactor (CVD reactor model number: 650 obtained from sp3 Diamond Technologies Inc., USA). Tungsten filament was used to heat the seeded substrate 210 within the CVD reactor. The temperature of the tungsten filament was controlled at about 2200° C. and the temperature of the substrate 210 at about 800° C. The temperature of the tungsten filament was monitored using a pyrometer and the temperature of the substrate was measured using a K-type thermocouple.

The NCD layer 220 was chemically vapor deposited onto the first surface of the heated substrate 210 by passing a gaseous mixture of methane at a gas flow rate of about 80 scan and hydrogen at a gas flow rate of about 3000 sccm. The pressure within the CVD reactor was controlled at about 5 Torr (666.61 Pa). The whole growth process was performed for about 3 hours and the thickness of the deposited NCD layer was measured to be about 1.4 microns.

Example 2

Deposition of a PZT Layer on a NCD Layer

The silicon substrate 210 with the NCD layer 220 as described above were placed with a PZT target having composition $PbZr_{0.52}Ti_{0.48}O_3$ within the PLD chamber procured from Hind Hivac Pvt. Ltd, Bangalore, India. Here, about 5 mol % of lead oxide (PbO) was added to the target to compensate for lead and oxygen loss during deposition and post-annealing process. The substrate 210 was mounted on a resistive heater parallel to the target surface within the PLD chamber. A third harmonic beam of a Nd:YAG laser (Model: Brilliant 355 nm, 10 Hz frequency from Quantel of France) having an energy density of about 2.2 $J/cm^2$ was focused to the target at an angle of about 45 degrees to deposit the PZT layer 260 and the base pressure of the PLD chamber is maintained at about $2 \times 10^{-6}$ mbar.

Subsequently, oxygen was introduced within the PLD chamber at a fixed flow rate and the deposition pressure within the PLD chamber was maintained at about 0.5 mbar. The deposition temperature within the PLD chamber was controlled at about 550° C. The deposited PZT layer 260 was annealed at the deposition temperature for about 1 hour. The deposition process was carried for about 10 minutes and thickness of the PZT layer 260 was measured to be about 500 nanometers. The thickness of the PZT layer 260 was measured using an optical profilometer.

Example 3

Figure 3:
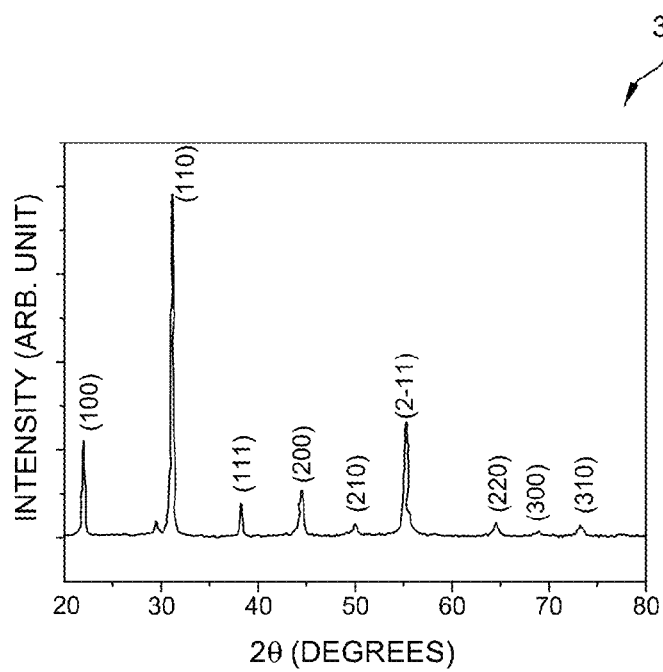
FIG. 3 is an example X-ray diffraction (XRD) pattern of a perovskite PZT layer deposited on a NCD layer formed on a base silicon substrate.

Phase and Crystalline Analysis of the PZT Layer Deposited on the NCD Layer of the Silicon Substrate The phase and crystalline analysis of a PZT layer 260 deposited at 550° C. and 0.5 mbar of oxygen partial pressure after in-situ annealing for about 1 hour was performed by X-ray diffraction (XRD) with Cu Kα radiation. FIG. 3 shows the X-ray diffraction (XRD) pattern 300 of the PZT layer. The XRD pattern was obtained using X'pert PRO XRD system from PANalytical of Netherlands. As can be seen from the XRD pattern, the crystallographic orientation in the XRD pattern 300 clearly indicates a perovskite structure of the PZT layer.

Example 4

Microstructure Examination of the PZT Layer

Figure 4:
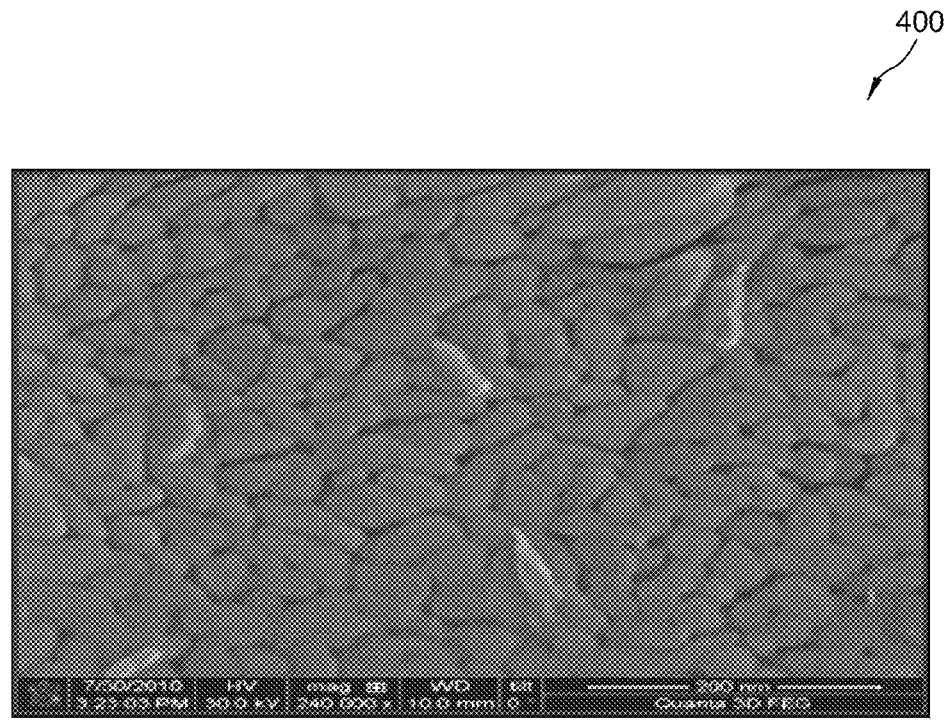
FIG. 4 is an example field emission scanning, electron microscope (SEM) image of the PZT layer deposited on a NCD layer formed on a base silicon substrate.

The microstructure of the PZT layer 260 deposited on the NCD layer 220 at deposition temperature of 550° C. and 0.5 mbar of oxygen partial pressure was observed using field emission scanning electron microscope (SEM) [Model—Quanta 3D from FEI of Oregon, USA]. FIG. 4 shows the SEM image 400 of the PZT layer 260. As can be seen, the PZT layer 260 exhibited a densely packed, smooth and pinhole-free nanostructure. The average grain size of the PZT layer 260 was measured to be about 40 nanometers.

Example 5

Raman Spectra of Deposited PZT Layer

Figure 5:
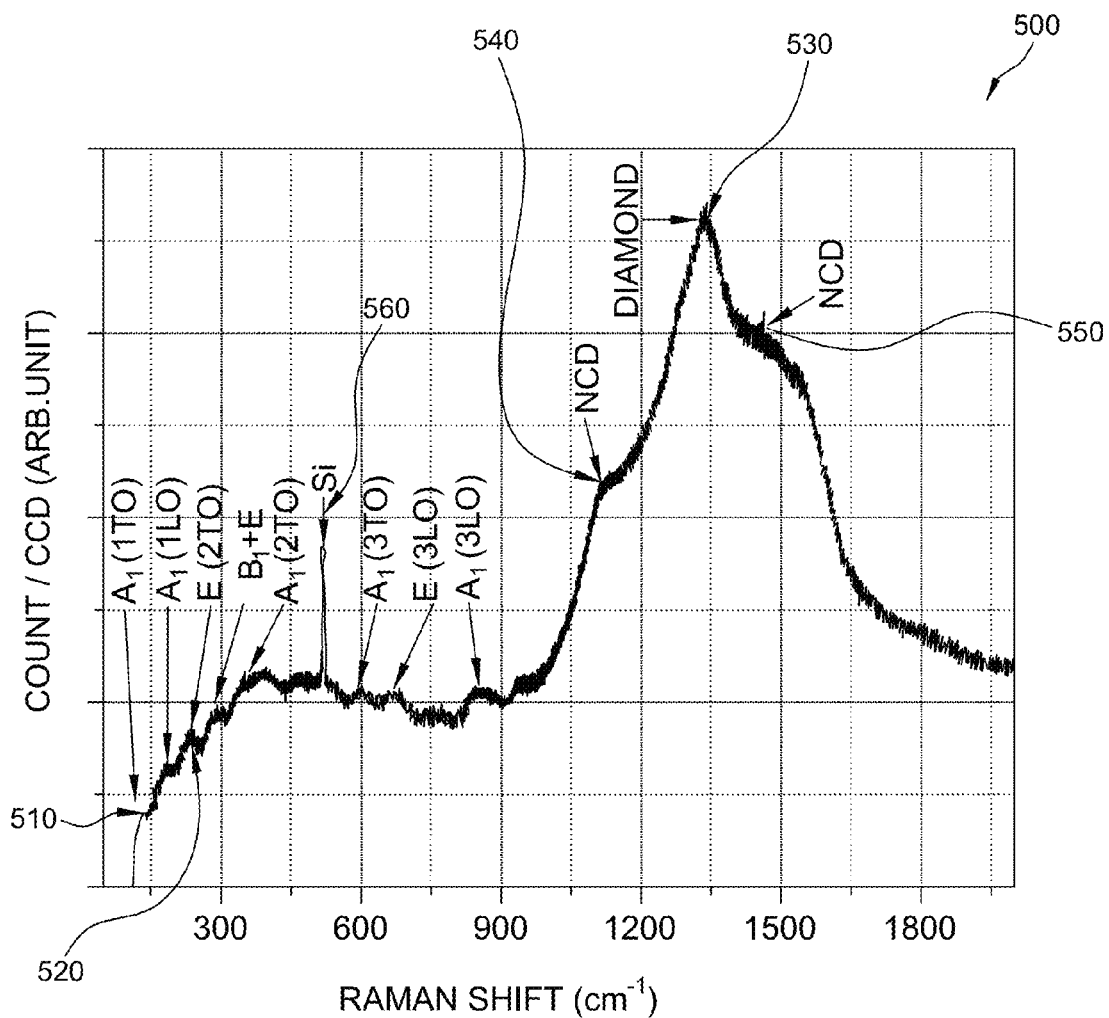
FIG. 5 is an example Raman spectra of the PZT layer deposited on the NCD layer formed on a base silicon substrate.

The Raman spectra of the PZT layer 260 deposited on the NCD layer 220 of the silicon substrate 210 described above was recorded using a confocal Raman microscope [Model: Alpha 300, from Witec, Germany]. FIG. 5 shows the Raman spectra 500 of the PZT layer. The spectra 500 of the deposited PZT layer shows all peaks corresponding to that of the PZT layer such as represented by reference numerals 510 and 520 along with the peak 530 of the diamond layer located at a frequency of about 1332 $cm^{-1}$. Moreover, the frequencies of PZT Raman modes was about 133 $cm^{-1}$ for the transverse optical1 mode (A1(1TO)), about 192 $cm^{-1}$ for the longitudinal optical1 mode (A1(1LO)), about 230 $cm^{-1}$ for the transverse optical2 mode (E(2TO)), about 287 $cm^{-1}$ for (B1+E), about 349 $cm^{-1}$ for the transverse optical2 mode (A1(2TO)), about 592 $cm^{-1}$ for the transverse optical3 mode (A1(3TO)), about 678 $cm^{-1}$ for the longitudinal optical3 mode (E(3LO)), and about 843 $cm^{-1}$ for longitudinal optical3 mode (A1(3LO)).

It should be noted that the peak 530 at the frequency of about 1332 cm$^{-1}$ represented a triply degenerate centre phonon mode ($F_{2g}$) of the NCD layer. Moreover, the peaks 540 and 550 at frequencies of about 1150 cm$^{-1}$ ($v_1$) and about 1450 cm$^{-1}$ ($v_2$) respectively were assigned to trans-polyacetylene (trans-PA) lying in the grain boundaries of finite crystalline size that is less than about 500 nm diamond films, generally termed as nanocrystalline diamond (NCD) thin films. It should be noted that the two peaks (at frequencies of 1150 cm$^{-1}$ and 1450 cm$^{-1}$ respectively) represent a signature of NCD. These peaks are typically not available for single crystalline diamond or microcrystalline diamond. These are observable only for NCD due to its large grain boundary density thereby confirming the NCD layer formation. Further, the peak represented by reference numeral 560 at a frequency of about 521 cm$^{-1}$ corresponded to the base silicon substrate.

Example 6

Atomic Force Microscopy (AFM) Results for the PZT Layer

Figure 6:
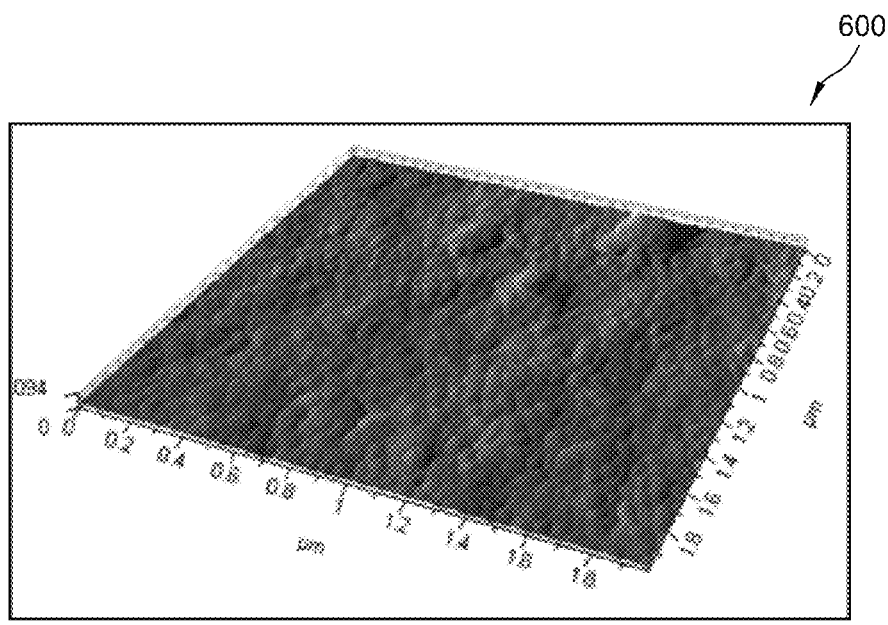
FIG. 6 is an example atomic force microscopy (AFM) image of the PZT layer deposited on the NCD layer formed on a base silicon substrate.
Figure 7:
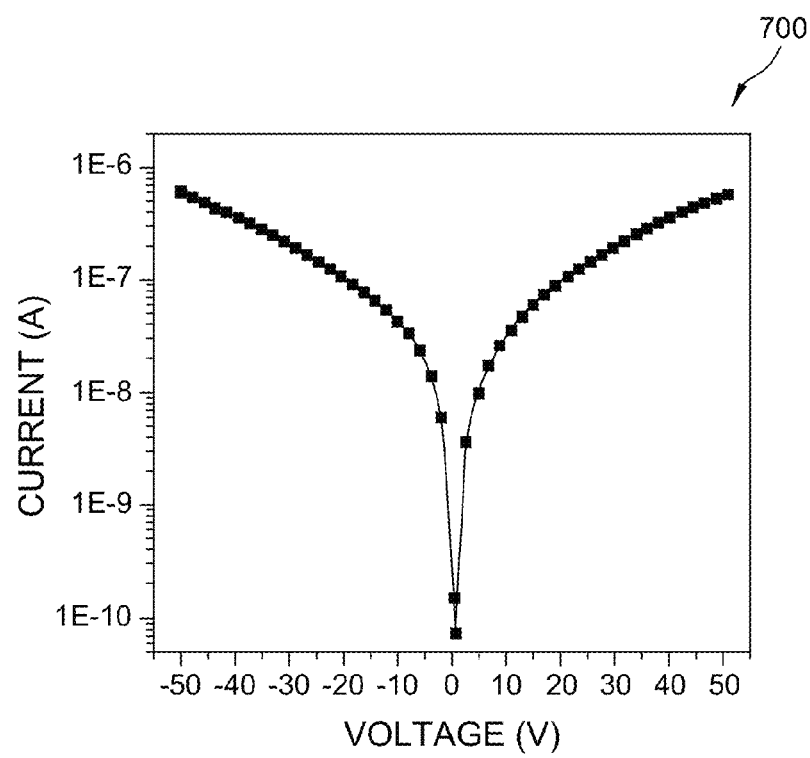
FIG. 7 is a graphical representation of current-voltage characteristics of the PZT layer deposited on the NCD layer formed on a base silicon substrate.

FIG. 6 shows the AFM image 600 of the PZT layer 260 deposited on the NCD layer 220 as described above. The AFM image was obtained using AFM Model No.: 550 from Agilent Technologies from USA. Two gold electrodes were deposited on the PZT layer 260 for performing the electrical measurements. The two electrodes were spaced apart at a distance of about 150 micrometers. The current-voltage characteristics 700 of the PZT film deposited on the NCD layer on a base silicon substrate are graphically represented in FIG. 7. As can be seen, a leakage current value corresponding to an applied voltage of about ±50 V was about 10$^{-6}$ A, which is indicative of a highly insulating PZT layer.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc.

As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A piezoelectric device, comprising:
   a substrate;
   a nanocrystalline diamond (NCD) layer disposed on a first surface of the substrate; and
   a perovskite piezoelectric layer deposited directly on a first surface of the nanocrystalline diamond layer,
   wherein the perovskite piezoelectric layer is selected from the group consisting of lead lanthanum zirconate titanate (PLZT) and lead zirconate titanate (PZT), and
   wherein the perovskite piezoelectric layer is annealed at a temperature of 525° C. to 600° C. for 30 minutes to 2 hours in an atmosphere comprising 0.4 mbar to 0.6 mbar oxygen gas.

2. The piezoelectric device of claim 1, wherein the substrate comprises silicon.

3. The piezoelectric device of claim 1, wherein the device is a surface acoustic wave (SAW) device, or a micro-electro-mechanical-system (MEMS) device.

4. The piezoelectric device of claim 1, wherein the perovskite piezoelectric layer is deposited on the nanocrystalline diamond (NCD) layer using a pulsed laser deposition (PLD) technique.

5. The piezoelectric device of claim 2, wherein the substrate has a thickness of 100 microns to 1000 microns.

6. The piezoelectric device of claim 1, wherein the perovskite piezoelectric layer has a thickness of 100 nm to 800 nm.

7. The piezoelectric device of claim 1, wherein the nanocrystalline diamond (NCD) layer has a thickness of 0.5 microns to 10 microns.

8. A piezoelectric device, comprising:
   a substrate;
   a nanocrystalline diamond (NCD) layer disposed on a first surface of the substrate; and
   a perovskite piezoelectric layer deposited directly on a first surface of the nanocrystalline diamond layer,
   wherein the perovskite piezoelectric layer consists of lead lanthanum zirconate titanate (PLZT), and
   wherein the perovskite piezoelectric layer is annealed at a temperature of 525° C. to 600° C. for 30 minutes to 2 hours in an atmosphere comprising 0.4 mbar to 0.6 mbar oxygen gas.

9. The piezoelectric device of claim 1, wherein the perovskite piezoelectric layer is a perovskite piezoelectric layer deposited by pulsed laser deposition at a deposition temperature of 525° C. to 600° C.

* * * * *